United States Patent [19]

Nakamura

[11] Patent Number: 5,545,611
[45] Date of Patent: Aug. 13, 1996

[54] OXIDE SUPERCONDUCTOR THIN FILM PREPARED BY MBE

[75] Inventor: Takao Nakamura, Osaka, Japan

[73] Assignee: Sumitomo Electric Industries, Ltd., Osaka, Japan

[21] Appl. No.: 414,423

[22] Filed: Mar. 31, 1995

Related U.S. Application Data

[62] Division of Ser. No. 152,385, Nov. 16, 1993, Pat. No. 5,403,819.

[30] Foreign Application Priority Data

Nov. 17, 1992 [JP] Japan .................................. 4-331041

[51] Int. Cl.$^6$ ........................................ B32B 9/00
[52] U.S. Cl. .................... 505/238; 505/190; 505/191; 505/701; 505/702; 428/930; 428/702; 427/62
[58] Field of Search .................... 505/238, 190, 505/701, 702, 473, 729, 191; 117/108; 427/62; 428/930, 702

[56] References Cited

U.S. PATENT DOCUMENTS 5,116,811  5/1992  Abe et al. ............................ 505/1
5,135,906  8/1992  Harada et al. ....................... 505/1

OTHER PUBLICATIONS

Wang et al., "High Tc Films by Molecular Beam Epitaxy", High Tc Superconductor Thin Films, edited by Correra (1992) pp. 549–554.
Schuhl et al., "Atomic Layer by Atomic Layer Growth of DyBaCuO Superconducting Thin Films by Molecular Beam Epitaxy", Appl. Phys. Lett. 57(8), Aug. 1990, pp. 819–821.
Watanabe et al., "Molecular Beam Epitaxy Study of $Bi_2Sr_2Cu_uO_x$ Using $NO_2$ as an Oxidizing Agent", Jpn. J. Appl. Phys., 29(7), Jul. 1990, pp. L1111–1113.

*Primary Examiner*—Roy V. King
*Attorney, Agent, or Firm*—Foley & Lardner

[57] ABSTRACT

An oxide superconductor thin film is formed on a substrate by emitting molecular beams of constituent elements of the oxide superconductor to the substrate under high vacuum, wherein at first a molecular beam of one of the constituent elements of the oxide superconductor, of which an oxide thin film can be deposited so as to have a smooth surface, is emitted so as to form the oxide thin film of one or two unit cells. And then, all the molecular beams of constituent elements of the oxide superconductor are emitted to the oxide thin film so as to form the oxide superconductor thin film.

13 Claims, 2 Drawing Sheets

5,545,611

OXIDE SUPERCONDUCTOR THIN FILM PREPARED BY MBE

This application is a division of application Ser. No. 08/152,385, filed Nov. 16, 1993, now U.S. Pat. No. 5,403,819.

BACKGROUND OF THE INVENTION

1. Field of the Invention

The present invention relates to a method for preparing superconducting thin film, and more specifically to an improved MBE (Molecular Beam Epitaxy) process particularly for preparing superconducting thin film formed of a high temperature superconductor oxide, which has a clean surface, high crystallinity and excellent superconducting properties.

2. Description of Related Art

High temperature superconductor oxides (abbreviated to oxide superconductors hereinafter) have higher critical temperatures than those of metal superconductors, and therefore have been considered to have high possibility of practical use. For example, Y—Ba—Cu—O type oxide superconductor has a critical temperature higher than 80K and it is reported that Bi—Sr—Ca—Cu—O type oxide superconductor and Tl—Ba—Ca—Cu—O type oxide superconductor have critical temperatures higher than 100K. The oxide superconductor has a crystalline anisotropy in superconducting characteristics, and in particular, its critical current density is maximum in a direction perpendicular to a c-axis of crystal lattice. Therefore, when the oxide superconductor is used, attention should be paid to the crystalline orientation.

In case of applying the oxide superconductor to superconducting electronics including superconducting devices and superconducting integrated circuits, the oxide superconductor has to be used in the form of a thin film having a thickness from a few nanometers to some hundreds nanometers. When the oxide superconductor is in the form of a thin film, the above mentioned crystalline anisotropy of superconducting characteristics may become more remarkable. In addition, in order to realize high performance superconducting devices and superconducting integrated circuits, high crystalline oxide superconductor thin films should be necessary.

Oxide superconductor thin films are often deposited by various sputtering processes, or a laser ablation process. However, in the case of controlling a thickness of a depositing oxide superconductor thin film precisely or depositing an oxide superconductor thin film and thin films of other materials successively, an MBE process may be the most suitable.

The MBE process is one of a vacuum evaporation process in which a thin film is deposited on a substrate by molecular beams from plural vapor sources or molecular beam sources which are arranged opposite to the substrate in a vacuum chamber. A Knudsen's cell (abbreviated to K cell hereinafter), a crucible heated by an electric gun, a laser heating crucible etc. are used for the vapor sources or molecular sources. In the MBE process, composition of a depositing thin film is controlled by ratios of intensity of the molecular beams. The intensity of the molecular beams is controlled by temperatures of crucibles of the vapor sources or molecular sources.

In order to deposit an oxide superconductor thin film, simple metal vapor sources are used. For example, when $Y_1Ba_2Cu_3O_{7-\sigma}$ oxide superconductor thin film is deposited, a metal yttrium vapor source, a metal barium vapor source and a metal copper vapor source are used. Oxidizing gas such as $O_2$ including $O_3$, $NO_2$ or $N_2O$ is supplied near the substrate so that the metal molecular beams are oxidized so as to form the oxide superconductor thin film on the substrate.

By the MBE process, it is possible to control thickness of a depositing thin film, layer by layer, and to deposit thin films of different kinds successively, under high vacuum. Therefore, by the MBE process, an oxide superconductor thin film can be deposited without unnecessary interface potential so that superconducting current with little turbulence flows through the oxide superconductor thin film. In addition, it is possible to form a sharp superconducting junction such as a Josephson junction by the MBE process.

The MBE processes can be classified into two kinds. One is so called a co-evaporation method in which all the molecular beams are sent simultaneously so that all the materials are supplied concurrently. Another is so called a sequential evaporation method in which each of the molecular beams is sent in a predetermined order so that a thin film is deposited layer by layer.

Since an oxide superconductor is a plural compound and has a layered crystalline structure, the sequential evaporation method is suitable for forming a high quality oxide superconductor thin film having a smooth surface. In a prior art, if an oxide superconductor thin film is deposited by the co-evaporation method, the oxide superconductor thin film has a rough surface and poor quality.

However, the oxide superconductor is composed of plural constituent atoms so that plural vapor sources and molecular beam sources are necessary to deposit an oxide superconductor thin film by an MBE process. In addition, the oxide superconductor has a layered crystalline structure which is composed of many atomic layers. Therefore, when an oxide superconductor thin film is deposited by the sequential evaporation method, vapor sources and molecular beam sources are controlled so as to supply molecular beams in the predetermined order. It might be difficult to precisely control intensity and emitting durations of plural molecular beams in the sequential evaporation method, so that it takes a lot of time and labor to form an oxide superconductor thin film by the sequential evaporation method.

Now, the present invention will be explained with reference to the accompanying drawings.

SUMMARY OF THE INVENTION

Accordingly, it is an object of the present invention to provide a method for preparing an oxide superconductor thin film which has a smooth upper surface, high crystallinity and excellent superconducting characteristics, which has overcome the above mentioned defects of the conventional ones.

The above and other objects of the present invention are achieved in accordance with the present invention by a method for preparing a thin film formed of an oxide superconductor on a substrate by emitting molecular beams of constituent elements of the oxide superconductor to the substrate under high vacuum, wherein emitting at first a molecular beam of one of the constituent elements of the oxide superconductor, of which an oxide thin film can be deposited so as to have a smooth surface, so as to form the oxide thin film of one or two unit cells, and emitting all the molecular beams of constituent elements of the oxide superconductor to the oxide thin film so as to form the oxide superconductor thin film. Namely, the method in accordance with the present invention is an improved co-evaporation method of MBE.

For example, when a thin film of $Y_1Ba_2Cu_3O_{7-\delta}$ oxide superconductor is prepared on a $SrTiO_3$ substrate or a MgO substrate by the method in accordance with the present invention, a BaO thin film should be deposited on the substrate, at the beginning. Since, a BaO thin film can grow so as to have a smooth surface on the substrate and a $Y_2O_3$ thin film and a CuO thin film grow insularly on the substrate.

Figure 1A:
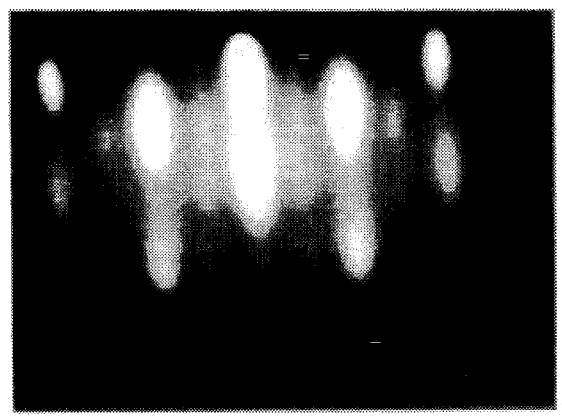
FIG. 1A is a RHEED (Reflecting High Energy Electron Diffraction) image of $Y_2O_3$ thin film deposited on a $SrTiO_3$ (100) substrate.
Figure 1B:
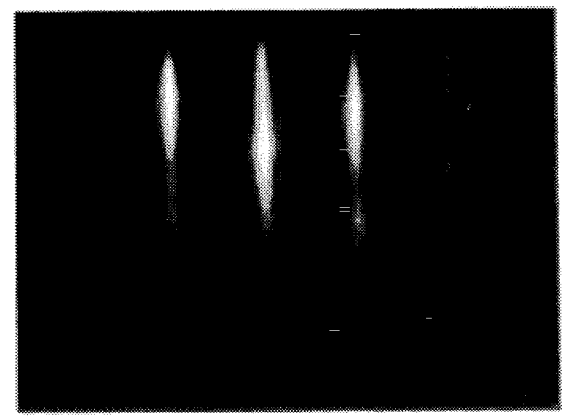
FIG. 1B is a RHEED image of BaO thin film deposited on a $SrTiO_3$ (00) substrate.
Figure 1C:
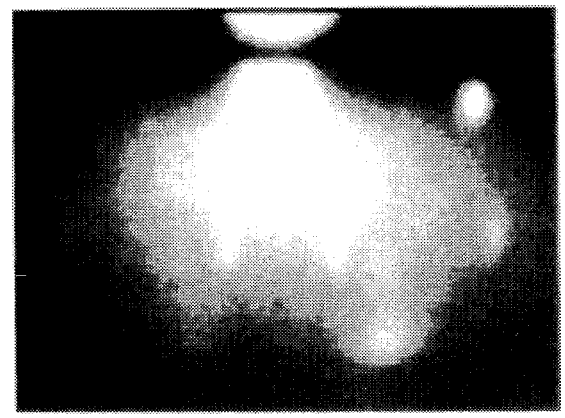
FIG. 1C is a RHEED image of CuO thin film deposited on a $SrTiO_3$ (100) substrate.

FIG. 1A, 1B and 1C show RHEED images of the $Y_2O_3$ thin film, a BaO thin film and a CuO thin film deposited on $SrTiO_3$ (100) substrates by a MBE process. Some spots can be seen in FIGS. 1A and 1C, which show that the surface of the $Y_2O_3$ thin film and CuO thin film are uneven. On the contrary, some streaks can be seen in FIG. 1B, which shows that the surface of the BaO thin film is smooth.

By this, it becomes clear that a $Y_2O_3$ thin film and CuO thin film grow not filmily but insularly on $SrTiO_3$ (100) substrates at the beginning, so that surfaces of the deposited $Y_2O_3$ thin film and CuO thin film become uneven.

Therefore, the reason why a $Y_1Ba_2Cu_3O_{7-\delta}$ oxide superconductor thin film which is deposited by a co-evaporation method has a uneven surface is presumed that yttrium and copper which are supplied at the beginning of the deposition form islands on a substrate, so that the $Y_1Ba_2Cu_3O_{7-\delta}$ oxide superconductor thin film begins to grow insularly.

In order to form a high quality $Y_1Ba_2Cu_3O_{7-\delta}$ oxide superconductor thin film having a smooth surface, it is proposed that only barium is supplied at the beginning of the deposition so as to form a smooth BaO thin film on a substrate and yttrium, barium and copper are supplied on the BaO thin film.

In case of Bi—Sr—Ca—Cu—O type oxide superconductor such as $Bi_2Sr_2Ca_2Cu_3O_x$, it is recommended that only strontium is supplied at the beginning of the deposition so as to form a smooth SrO thin film on a substrate and bismuth, calcium and copper are supplied on the SrO thin film. Since SrO thin film deposited on a $SrTiO_3$ (100) substrate or a MgO (100) substrate has a smooth surface.

In accordance with the present invention, the method is effected under a condition the substrate is heated and an oxidizing gas is locally supplied to the proximity of the substrate so that the pressure of the proximity of the substrate becomes $6\times10^{-6}$ to $8\times10^{-5}$ Torr at a background pressure.

In the method in accordance with the present invention, the MBE is preferably effected at a background pressure lower than $1\times10^{-9}$ Torr. This quite low background pressure means that there is no leak nor any gas generation in the vacuum chamber of the MBE apparatus. Therefore, no contaminant, for example hydrocarbons and metal carbides, is deposited on the oxide superconductor prepared by the method in accordance with the present invention.

In a preferred embodiment, the oxidizing gas is selected from the group consisting of $O_2$ including 5 to 70 volume percent $O_3$, $N_2O$ and $NO_2$. These gases have higher oxidizing than pure $O_2$ and it is favorable for preparing an oxide superconductor thin film by the MBE.

According to one preferable embodiment of the present invention, the substrate is cooled down to the room temperature after the oxide superconductor thin film was deposited, in the atmosphere in which the oxide superconductor thin film was deposited. While the substrate is cooled down, the oxide superconductor crystal system of the thin film is transformed from a tetragonal system to an orthorhombic system. At this stage, the oxide superconductor thin film should be in the oxidizing atmosphere, in order to get excellent superconducting characteristics.

In one preferred embodiment, the MBE is effected while the oxidizing gas is struck onto a deposition surface of the substrate. By this, the pressure of the oxidizing gas on the deposition surface of the substrate was further elevated.

In case of $Y_1Ba_2Cu_3O_{7-\delta}$ oxide superconductor, the MBE is preferably effected at a substrate temperature of 650° to 730° C. by using metal yttrium, metal barium and metal copper as vapor sources. It is more preferable that the MBE is effected at a substrate temperature of 700° C. If the substrate temperature is lower than 650° C., the obtained $Y_1Ba_2Cu_3O_{7-\delta}$ oxide superconductor thin film constituted of polycrystals which includes c-axis orientated crystals and a-axis orientated crystals. On the contrary, if the substrate temperature exceeds 730° C., metal copper molecules are not oxidized so that the $Y_1Ba_2Cu_3O_{7-\delta}$ oxide superconductor can not obtained.

The same is true of $Bi_2Sr_2Ca_2Cu_3Ox$ oxide superconductor thin film. In this case, it is also proposed that the MBE is effected at a substrate temperature of 650° to 730° C. by using metal bismuth, metal strontium, metal calcium and metal copper as vapor sources.

The above vapor sources are preferably set to K cells. It is preferable that the temperature of the K cell of the metal yttrium is 1150° to 1350° C., more preferable 1220° C. the temperature of the K cell of the metal barium is 570° to 640° C., more preferable 620° C., and the temperature of the K cell of the metal copper is 950° to 1090° C., more preferable 1000° C. The temperature of the metal bismuth K cell is preferably 460° to 550° C. more preferably 500° C., the temperature of the metal strontium K cell is preferably 570° to 640° C., more preferably 600° C. and temperature of the metal calcium K cell is preferably 350° to 430° C., more preferably 400° C. The temperatures of the K cells are determined by geometric arrangement of the MBE apparatus and the material which constitutes the crucibles.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystallinity.

The above and other objects, features and advantages of the present invention will be apparent from the following description of preferred embodiments of the invention with reference to the accompanying drawings.

DESCRIPTION OF THE PREFERRED EMBODIMENTS

Figure 2:
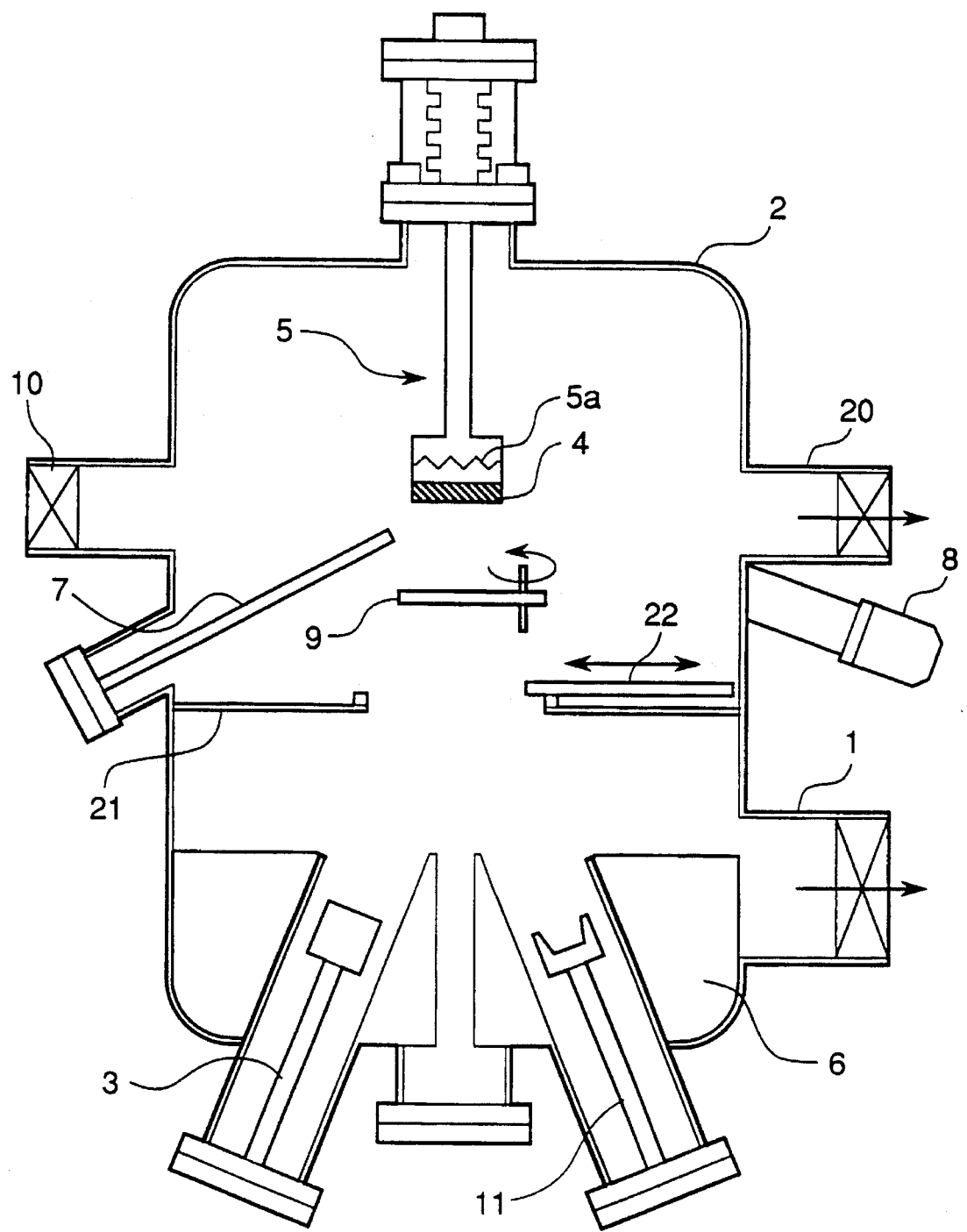
FIG. 2 is a diagrammatic sectional view of a film deposition apparatus which can be used for carrying out the process in accordance with the present invention.

Referring to FIG. 2, there is shown a diagrammatic sectional view of a film deposition apparatus which is used for carrying out the method in accordance with the present invention.

The shown film deposition apparatus basically includes a vacuum chamber 2 provided with a main evacuating apparatus 1, at least one K cell and at least one electron beam gun 11 provided at a bottom of the vacuum chamber 2, and a sample holder 5 provided at a top of the vacuum chamber 2 for holding a substrate 4 on which a film is to be deposited. The sample holder 5 is associated with a heater 5a for heating the substrate. In addition, the vacuum chamber 2 is also provided with a port 10 for exchanging a sample, a liquid nitrogen shroud 6 for forming a cold trap around an vapor source of the K cell, and a RHEED device 8 for observing a thin film roughness during the deposition. In front of the substrate held by the sample holder, a shutter 9 is located for controlling a deposition time during the deposition process. The K cell 3 and the electron beam gun 11 are provided with an openable shutter 19. It is noted that while FIG. 2 includes only a single cell 3, that the appartus is generally provided with a plurality of elements 3 one for each metal to be deposited. See the examples.

In addition, a gas supplying apparatus 7 is provided so as to introduce an oxidizing gas such as $O_2$, $O_3$, $NO_2$, $N_2O$, etc. in proximity of the substrate 4 held by the sample holder 5, so that the oxidizing gas can be supplied to form an oxygen-enriched atmosphere in the proximity of the substrate 4 in order to oxidize metal molecular beams incoming from the vapor source in the course of the film deposition.

Furthermore, the film deposition apparatus additionally includes a partition wall 21 for dividing the vacuum chamber 2 into a first subchamber 2A which is constituted of a lower portion of the vacuum chamber defined below the partition wall 21 and in which is located the K cell 3, the electron beam gun 11 and the main evacuating apparatus 1, and a second sub-chamber 2B which is constituted of an upper portion of the vacuum chamber defined above the partition wall 21 and in which sample holder 5 is located. The partition wall 21 includes a through opening 23 formed at a center thereof. The position of the opening 23 is determined to ensure that a beam emitted from K cell 3 and the electron beam gun 11 toward the substrate 4 is not obstructed by the partition wall 21. In addition, the size of the opening 23 is determined to enable restricted molecular flows between the first sub-chamber 2A and the second sub-chamber 2B so that a pressure difference can be created between the first sub-chamber 2A and the second sub-chamber 2B when the opening 23 is open. Therefore, the partition wall 21 having the through opening 23 constitutes a vacuum impedance.

A gate valve 22 is provided on the partition wall 21 for hermetically closing the opening 23 of the partition wall 21, so as to completely shut off the molecular flows between the first sub-chamber 2A and the second sub-chamber 2B when the gate valve 22 is closed. An opening and closing of this gate valve 22 is controlled from the outside of the film deposition apparatus by a not shown means.

In addition, an auxiliary evacuating apparatus 20 is coupled to the second sub-chamber 2B for evacuating the second sub-chamber 2B to an ultra-high vacuum when the gate valve 22 is closed. The auxiliary evacuating apparatus 20 is constituted of a cryopump. On the other hand, the main evacuating apparatus 1 is constituted of a diffusion pump.

EXAMPLE 1

A thin film of $Y_1Ba_2Cu_3O_{7-\delta}$ oxide superconductor was prepared by using the apparatus of FIG. 1 by the method in accordance with the present invention.

At first, a BaO thin film was deposited on a $SrTiO_3$ (100) substrate. A $SrTiO_3$ (100) substrate 4 was set to the sample holder 5, and metal yttrium, metal barium and metal copper were set to three K cells 3 as vapor sources. Thereafter, the chamber 2 was closed and the gate valve 22 was opened. The vacuum chamber 2 was evacuated by the main evacuating apparatus 1 and the auxiliary evacuating apparatus 20 to an ultra-high vacuum of which the pressure was lower than $1\times10^{-9}$ Torr in which background pressure the film deposition by the MBE process was available. Succeedingly, $O_2$ gas including 8 volume percent $O_3$ was supplied from the gas supplying device 7 so that the pressure in the second chamber 2B became $5\times10^{-5}$ Torr. As mentioned above, the vacuum chamber 2 was provided with the vacuum impedance (the partition wall 21 having the through opening 23), a pressure difference of about one digit or more was created between the first sub-chamber 2A and the second sub-chamber 2B. In addition, the oxidizing gas jelled from the gas supplying device 7 was struck onto a deposition surface of the substrate, the pressure of the oxidizing gas on the deposition surface of the substrate was further elevated.

Then, the substrate 4 was heated by the heater 5a to a temperature of 700° C. The K cell 3 of metal yttrium was heated to a temperature of 1220° C., the K cell 3 of metal barium was heated to a temperature of 620° C. and the K cell 3 of metal copper was heated to a temperature of 1000° C. Thereafter, pure $O_3$ was supplied from the gas supplying device 7 so as to strike onto and clean a deposition surface of the substrate 4. After the deposition surface of the substrate 4 was cleaned, $O_2$ gas including 8 volume percent $O_3$ was supplied from the gas supplying device 7, again.

When molecular beams had become to be stably generated from the vapor sources, the shutters 9 and 19 of the K cell 3 of metal barium were opened so as to start deposition of BaO thin film onto the substrate 4. At this time, a surface roughness and growing state of this deposited film was observed by the RHEED device 8. The BaO thin film of one or two unit cells was grown up and then the shutter 9 was closed. The other conditions were maintained for 5 to 10 minutes, so that the BaO thin film might be smooth by migration of BaO moleculars.

Thereafter, all the shutters 9 and 19 of the K cells 3 were opened so that $Y_1Ba_2Cu_3O_{7-\delta}$ oxide superconductor thin film grew on the BaO thin film. At this time, a surface roughness of this deposited film was observed by the RHEED device. The oxide superconductor thin film was grown up to a thickness of 100 nanometers at a deposition rate of 1 nanometer/minute. The deposition rate is preferably 0.5 to 2 nanometers/minute.

When the oxide superconductor thin film has reached a thickness of 100 nanometers, the substrate 4 was cooled down to the room temperature. While the substrate 4 was cooled down, the substrate 4 was maintained in the condition in which the oxide superconductor thin film was deposited.

After the oxide superconductor thin film was obtained, crystal structure and surface condition of the oxide superconductor thin film was evaluated LEED (Low Energy Electron Diffraction) and XPS (X-ray Photoelectron Spectroscopy) without exposing the oxide superconductor thin film to the air. It became clear that the oxide superconductor thin film was a c-axis orientated $Y_1Ba_2Cu_3O_{7-\delta}$ oxide superconductor thin film.

In the LEED image of the oxide superconductor thin film prepared by the above process in accordance with the present invention, some spots are observed. This reveals such a fact that the oxide superconductor thin film has a crystalline surface.

In the XPS spectra LEED image of the oxide superconductor thin film prepared by the above process in accordance with the present invention in a range in which peaks of Cu can be observed, intensive satellite peaks of Cu can be observed. This reveals such a fact that the surface of the oxide superconductor thin film prepared by the above process in accordance with the present invention has excellent superconductivity.

EXAMPLE 2

A thin film of $Bi_2Sr_2Ca_2Cu_3O_x$ oxide superconductor was prepared by using the apparatus of FIG. 1 by the method in accordance with the present invention.

At first, a SrO thin film was deposited on a $SrTiO_3$ (100) substrate. A $SrTiO_3$ (100) substrate 4 was set to the sample holder 5, and metal bismuth, metal strontium, metal calcium and metal copper were set to four K cells 3 as vapor sources. Thereafter, the chamber 2 was closed and the gate valve 22 was opened. The vacuum chamber 2 was evacuated to an ultra-high vacuum of which the pressure was lower than $1 \times 10^{-9}$ Torr. Succeedingly, $O_2$ gas including 8 volume percent $O_3$ was supplied from the gas supplying device 7 so that the pressure in the second chamber 2B became $5 \times 10^{-5}$ Torr.

Then, the substrate 4 was heated by the heater 5a to a temperature of 700° C. The K cell 3 of metal bismuth was heated to a temperature of 500° C., the K cell 3 of metal strontium was heated to a temperature of 600° C., the K cell 3 of metal calcium was heated to a temperature of 400° C. and the K cell 3 of metal copper was heated to a temperature of 1000° C. Thereafter, pure $O_3$ was supplied from the gas supplying device 7 so as to strike onto and clean a deposition surface of the substrate 4. After the deposition surface of the substrate 4 was cleaned, $O_2$ gas including 8 volume percent $O_3$ was supplied from the gas supplying device 7, again.

When molecular beams had become to be stably generated from the vapor sources, the shutters 9 and 19 of the K cell 3 of metal strontium were opened so as to start deposition of SrO thin film onto the substrate 4. At this time, a surface roughness and growing state of this deposited film was observed by the RHEED device 8. The SrO thin film of one or two unit cells was grown up and then the shutter 9 was closed. The other conditions were maintained for 5 to 10 minutes, so that the SrO thin film might be smooth by migration of SrO moleculars.

Thereafter, all the shutters 9 and 19 of the K cells 3 were opened so that $Bi_2Sr_2Ca_2Cu_3O_x$ oxide superconductor thin film grew on the SrO thin film. At this time, a surface roughness of this deposited film was observed by the RHEED device. The oxide superconductor thin film was grown up to a thickness of 100 nanometers at a deposition rate of 1 nanometer/minute. The deposition rate is preferably 0.5 to 2 nanometers/minute.

When the oxide superconductor thin film has reached a thickness of 100 nanometers, the substrate 4 was cooled down to the room temperature. While the substrate 4 was cooled down, the substrate 4 was maintained in the condition in which the oxide superconductor thin film was deposited.

After the oxide superconductor thin film was obtained, crystal structure and surface condition of the oxide superconductor thin film was evaluated LEED (Low Energy Electron Diffraction) and XPS (X-ray Photoelectron Spectroscopy) without exposing the oxide superconductor thin film to the air. It became clear that the oxide superconductor thin film was a c-axis orientated $Bi_2Sr_2Ca_2Cu_3O_x$ oxide superconductor thin film.

In the LEED image of the oxide superconductor thin film prepared by the above process in accordance with the present invention, some spots are observed. This reveals such a fact that the oxide superconductor thin film has a crystalline surface.

In the XPS spectra LEED image of the oxide superconductor thin film prepared by the above process in accordance with the present invention in a range in which peaks of Cu can be observed, intensive satellite peaks of Cu can be observed. This reveals such a fact that the surface of the oxide superconductor thin film prepared by the above process in accordance with the present invention has excellent superconductivity.

As explained above, an oxide superconductor thin film which has an excellent surface condition can be obtained without switching molecular beams by the method in accordance with the present invention. Namely, in accordance with the present invention, an oxide superconductor thin film can be easily deposited by a MBE process. The oxide superconductor thin film prepared by the process in accordance with the present invention has a high crystalline, smooth, clean and excellent superconductive surface. Therefore, the oxide superconductor thin film is suitable for a lower layer of stacked films.

The invention has thus been shown and described with reference to the specific embodiments. However, it should be noted that the present invention is in no way limited to the details of the illustrated structures but converts and modifications may be made within the scope of the appended claims.

I claim:

1. An oxide superconductor thin film prepared by emitting under vacuum, a molecular beam of one of the constituent elements of the oxide superconductor to a substrate to form a first oxide thin film which has a smooth surface and a thickness of one or two units cells, and emitting under vacuum, molecular beams of all of the constituent elements of the oxide superconductor to the first oxide thin film so as to form the oxide superconductor thin film on the first oxide thin film.

2. A device containing an oxide superconducting thin film as claimed in claim 1.

3. An oxide superconductor thin film as claimed in claim 1, wherein the oxide superconductor is formed of a high-$T_c$ oxide superconductor.

4. An oxide superconductor thin film as claimed in claim 3, wherein the oxide superconductor is formed of a high-$T_c$ copper-oxide compound oxide superconductor.

5. An oxide superconductor thin film as claimed in claim 4, wherein the oxide superconductor is a $Y_1Ba_2Cu_3O_{7-\delta}$ oxide superconductor.

6. An oxide superconductor thin film as claimed in claim 4, wherein the oxide superconductor is a $Bi_2Sr_2Ca_2Cu_3O_x$ oxide superconductor.

7. An oxide superconductor thin film as claimed in claim 1, wherein the substrate is formed of an insulator.

8. An oxide superconductor thin film as claimed in claim 7, wherein the substrate is formed of a material selected from the group consisting of MgO (100) $SrTiO_3$ (100), and $CdNdAlO_4$ (001).

9. An oxide superconductor thin film as claimed in claim 5, wherein the first oxide thin film is a BaO thin film.

10. An oxide superconductor thin film as claimed in claim 9, wherein the substrate is formed of $SrTiO_3$ (100).

11. An oxide superconductor thin film as claimed in claim 6, wherein the first oxide thin film is a SrO thin film.

12. An oxide superconductor thin film as claimed in claim 6, wherein the substrate is formed of $SrTiO_3$ (100).

13. An oxide superconductor thin film as claimed in claim 1, which is a lower layer of a stacked film.

* * * * *